United States Patent [19]

Nagao

[11] Patent Number: 5,089,793
[45] Date of Patent: Feb. 18, 1992

[54] SEMICONDUCTOR DEVICE HAVING AN OSCILLATORY CIRCUIT

[75] Inventor: Hidenori Nagao, Nagano, Japan

[73] Assignee: Seiko Epson Corporation, Tokyo, Japan

[21] Appl. No.: 586,677

[22] Filed: Sep. 24, 1990

[30] Foreign Application Priority Data

Oct. 16, 1989 [JP] Japan .................... 1-268621
Aug. 24, 1990 [JP] Japan .................... 2-221188

[51] Int. Cl.$^5$ .............................. H03B 1/00
[52] U.S. Cl. .................... 331/46; 331/49; 307/269
[58] Field of Search ........... 331/46, 49; 307/269; 328/61

[56] References Cited

U.S. PATENT DOCUMENTS 4,882,738 11/1989 Suzuki .................... 331/49 X

FOREIGN PATENT DOCUMENTS 0168709 10/1986 Japan .

*Primary Examiner*—Robert J. Pascal
*Attorney, Agent, or Firm*—Ladas & Parry

[57] ABSTRACT

Disclosed is a semiconductor device in which a CPU and an oscillation circuit are driven with the same driving voltage. The oscillation circuit is constituted by a plurality of oscillation invertors having different characteristics respectively corresponding to different reference voltages for driving the CPU. One of the oscillation invertors is selected corresponding to the driving voltage of the CPU so that the oscillation signal of the selected oscillation circuit is sent out as a system clock. It is therefore possible to obtain preferable characteristics that, when the driving voltage of the CPU is changed over in accordance with a program, fluctuation in the driving ability of the oscillation invertors, which has been conventionally generated, is prevented from occurring, so that oscillation easily starts upon turning-on of a power supply, oscillation hardly stops when a source voltage becomes low, and high harmonics oscillation hardly occurs.

7 Claims, 3 Drawing Sheets

SEMICONDUCTOR DEVICE HAVING AN OSCILLATORY CIRCUIT

BACKGROUND OF THE INVENTION

The present invention relates to semiconductor devices including oscillation circuits, and particularly relates to an oscillation circuit which can cope with changes in a driving voltage for a semiconductor device.

In a conventional semiconductor device, for example, reference voltage generating circuits for generating voltages different from each other as reference voltages respectively are provided, and one of the reference voltages is selected in accordance with a command issued from a CPU so that the selected reference voltage is used as a driving voltage for the CPU. More specifically, one of a low driving voltage and a high driving voltage is selected, according to demand, corresponding to the speed of operational processing of the CPU.

However, since the same driving voltage as that for the CPU is applied to an oscillation circuit, the driving ability of an oscillation invertor constituting the oscillation circuit fluctuates depending on the value of the driving voltage as follows.

a) In the case where the driving ability of the oscillation invertor is designed so as to be somewhat low, when the supply voltage for the oscillation circuit is switched to a low value, oscillation is apt to stop, while oscillation hardly starts from the state of stoppage of the oscillation.

b) In the case where the driving ability of the oscillation circuit is designed so as to be somewhat high, when the supply voltage of the oscillation circuit is switched to a high value, high harmonics oscillation occurs so that the device operates erroneously.

SUMMARY OF THE INVENTION

It is therefore an object of the present invention to solve the problems in the prior art.

It is another object of the present invention to provide a semiconductor device in which stable oscillation can be performed even if the driving voltage for an oscillation circuit is changed over.

In order to attain the above objects, according to an aspect of the present invention, the semiconductor device comprises: a plurality of reference voltage generating circuits for generating reference voltages different from each other; a selection control storage circuit for storing a selection signal for selecting one of the reference voltage generating circuits in accordance with a command from a CPU; a plurality of analog switches provided respectively corresponding to the reference voltage generating circuits, each of the analog switches being arranged so as to open on the basis of the selection signal supplied thereto thereby send out the reference voltage from the corresponding reference voltage generating circuit; and an oscillation circuit constituted by a plurality of oscillation invertors provided respectively corresponding to the reference voltage generating circuits, the oscillation invertors being provided with the reference voltages supplied through the analog switches as driving voltages, the oscillation invertors being selected on the basis of the selection signal supplied thereto so that an oscillation signal of the selected one of the oscillation invertors is supplied to a microcomputer as a system clock.

The selection control storage circuit stores a selection signal for selecting one of the reference voltage generating circuits in accordance with the command issued from the CPU, while the analog switches are selectively opened on the basis of the selection signal supplied thereto so that selected one of the reference voltages of the respective reference voltage generating circuits is outputted through the selected analog switch. That is, the oscillation invertors of the oscillation circuit are selected on the basis of the selection signal supplied thereto, and the selected reference voltage is passed through the selected analog switch.

For example, the oscillation invertor having a high driving ability is selected when the reference voltage is low, while the oscillation invertor having a low driving ability is selected when the reference voltage is high, so that the operation of oscillation is performed stably. The oscillation signal is supplied, as a system clock, to the microcomputer.

Thus, according to the present invention, the oscillation circuit is constituted by a plurality of oscillation invertors having characteristics corresponding to the reference voltages and one of the oscillation invertors is selected corresponding to the driving voltage for the CPU, so that it is possible to prevent the fluctuation which may be occur in the driving ability of the oscillation invertor at the time of change-over of the driving voltage in accordance with a program. As a result, it is possible to realize a semiconductor device which shows preferable characteristics that oscillation easily starts upon turning-on of the power supply, oscillation hardly stops when the power supply becomes lower, and high harmonics oscillation hardly occurs.

Further, in the case where an operational amplifier is provided between the analog switches and the low frequency (LF) oscillation circuit, the reference voltage passed through the selected one of the analog switches is supplied, after stabilized, to the low frequency oscillation circuit and the microcomputer as the driving voltage therefor. Thus, a stable driving voltage can be obtained.

The above and other objects as well as advantageous features of the invention will become more clear from the following description taken in conjunction with the drawings.

DESCRIPTION OF THE PREFERRED EMBODIMENTS

Figure 1:
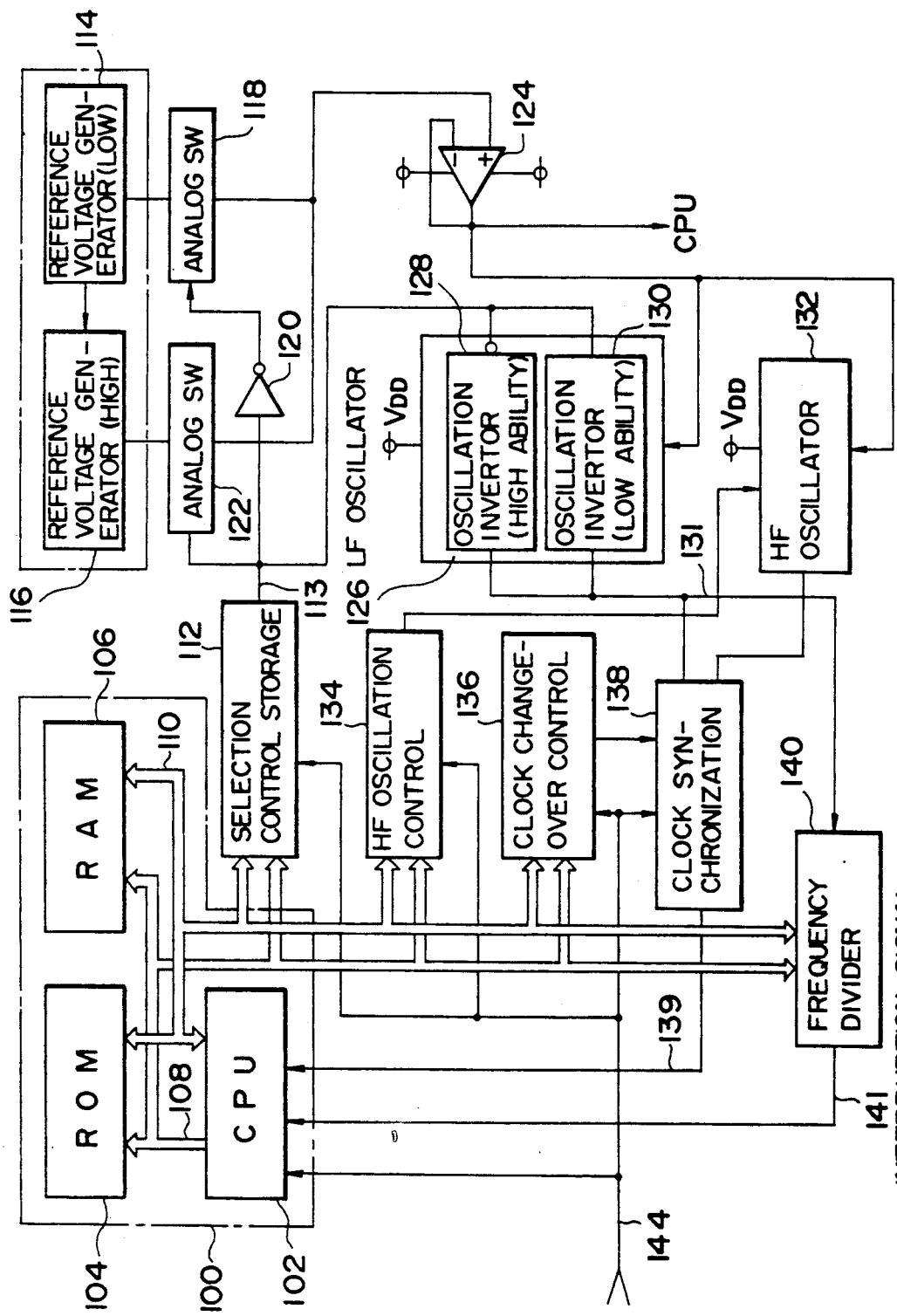
FIG. 1 is a block diagram showing the configuration of an embodiment of the semiconductor device according to the present invention.

FIG. 1 is a block diagram of an embodiment of the semiconductor device according to the present invention. A microcomputer 100 is constituted by a CPU 102 for performing execution of an operating function, control on the computer operation, etc., an ROM 104 having a system program stored therein for driving the CPU 101, etc., an RAM 106 for storing various kinds of data, etc., an address bus 108, and a data bus 110 for delivery of data. The CPU 102, the ROM 104 and the RAM 106 are connected to each other through the address bus 108 and the data bus 110.

A selection control storage circuit 112 is constituted by, for example, a decoder and a latch circuit such as a D-type flip-flop circuit, a register of the like so as to be set to "1" or "0" on the basis of the operational processing of the CPU 102. This configuration is similar to that of each of a high frequency (HF) oscillation control circuit 134 and a clock change-over control circuit 136. Reference voltage generating circuits 114 and 116 generate reference voltages different from each other, for example, the voltage generated by the former being higher than that generated by the latter.

Analog switches 118 and 122 are connected to the reference-voltage generating circuits 114 and 116 respectively so as to select one of the reference voltages in accordance with a selection control signal 113 produced from the selection control storage circuit 112. The selection control signal 113 is applied to the analog switch 118 through an invertor 120 while applied to the analog switch 122 directly, so that two analog switches 118 and 122 are not turned on at the same time but are always operated reversely to each other.

An operational amplifier 124 makes more stable one of the reference voltages selected by the selected one of the analog switches 118 and 122, and supplies the stabilized voltage, as a driving voltage, to the microcomputer 100, a low frequency (LF) oscillation circuit 126, and a high frequency (HF) oscillation circuit 132.

The low frequency oscillation circuit 126 is constituted by an oscillation invertor 128 having a high driving ability and another oscillation invertor 130 having a driving ability lower than that of the oscillation invertor 128. The oscillation invertors 128 and 130 are selected in accordance with the selection control signal 113. The difference in ability between the oscillation invertors 128 and 130 in the low frequency oscillation circuit 126 is realized by providing a difference in ratio W/L between FETs constituting the respective oscillation invertors 128 and 130, in which W and L represent a channel width and a channel length respectively of each FET. The larger the ratio W/L, the larger the driving ability.

The high frequency oscillation circuit 132 is constituted by, for example, a CR oscillation circuit, and the operation of the high frequency oscillation circuit 132 is controlled by the high frequency oscillation control circuit 134. The clock change-over control circuit 136 produces a change-over signal in accordance with a control command supplied from the CPU 102. A clock synchronization circuit 138 is supplied with the oscillation signals from the low and high frequency oscillation circuits 126 and 132 respectively, and selects one of the oscillation signals on the basis of the change-over signal supplied from the clock change-over control circuit 136. The clock synchronization circuit 138 synchronizes the selected oscillation signal and then supplies the CPU 102 with the synchronized oscillation signal as a system clock 139. A frequency divider circuit 140 is supplied with the oscillation signal from the low frequency oscillation circuit 126 and supplies an interruption signal 140 to the CPU 102. A reset control line 144 is connected so as to supply a reset signal to the CPU 102, the selection control storage circuit 112, the high frequency oscillation control circuit 134, and the clock change-over control circuit 136.

Figure 2:
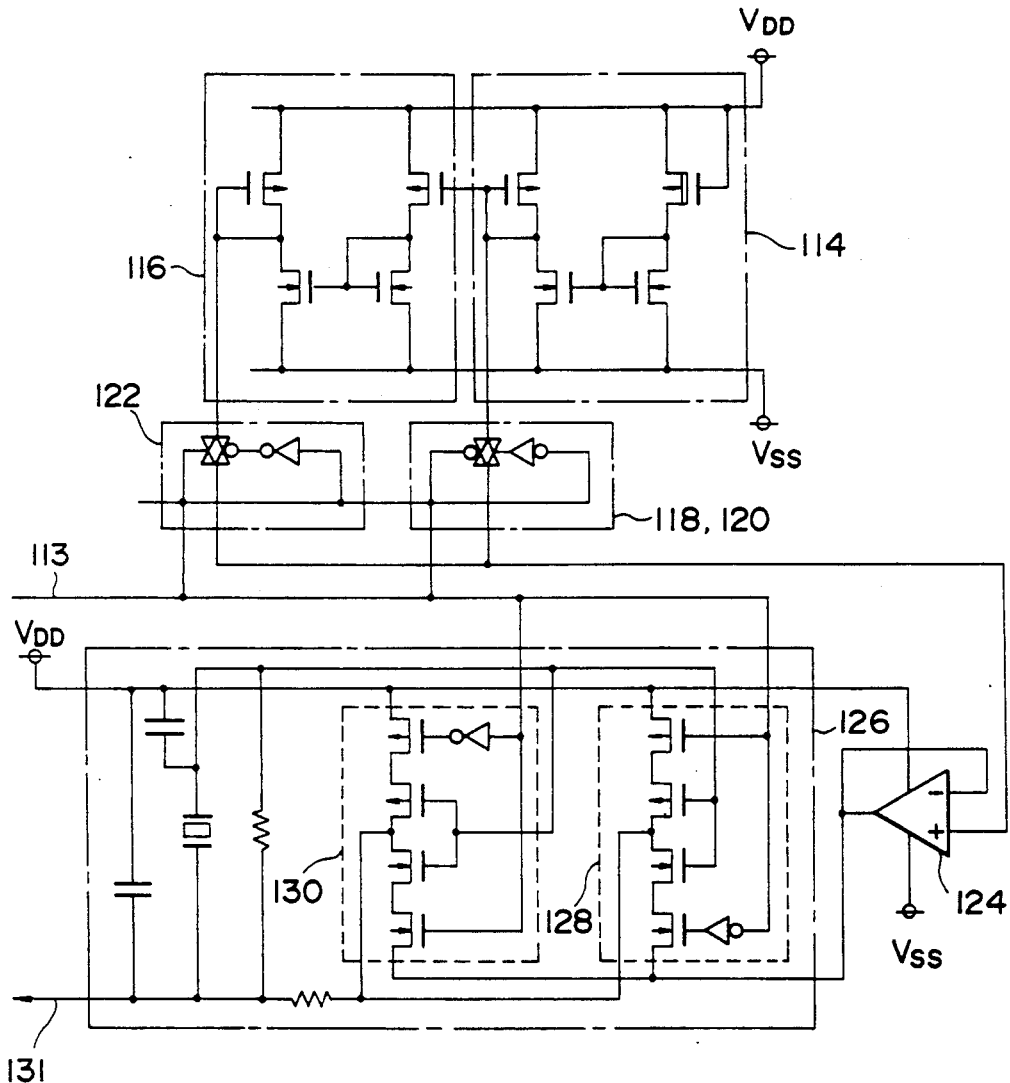
FIG. 2 is a circuit diagram showing a specific embodiment of a part of the configuration of FIG. 1.

FIG. 2 is a circuit diagram showing a specific embodiment of a part of FIG. 1 including the reference voltage generating circuits 114 and 116, the analog switches 118 and 122, the invertor 120, and the low frequency oscillation circuit 126.

The operation of the embodiment of the semiconductor device having such a configuration as described above will be described hereunder.

First, the CPU 102, the selection control storage circuit 112, the high frequency oscillation control circuit 134, and the clock change-over control circuit 136 are initialized when a reset signal is supplied from the outside to the reset signal line 144. That is, a program counter of the CPU 102 is set to an initial address. The selection control storage circuit 112 is set to "0" so that the level of the output thereof becomes LOW. Further, the high frequency oscillation control circuit 134 is set to "0" as an initial state thereof so that the output signal thereof makes the high frequency oscillation circuit 132 stop. The clock change-over control circuit 136 is set to "0" as an initial state thereof so that the selection control signal thereof causes the clock synchronization circuit 138 to select the oscillation signal of the low frequency oscillation circuit 126.

Next, the initialized or LOW output of the selection control storage circuit 112 makes the analog switches 118 and 122 ON and OFF respectively, so that a voltage, for example IV, generated by the reference voltage generating circuit 114 is supplied to the input of the operational amplifier 124. The operational amplifier 124 stabilizes the inputted voltage and supplies the stabilized voltage, as a driving voltage, to the microcomputer 100, the low frequency oscillation circuit 126, and the high frequency oscillation circuit 132. Further, the initialized output of the selection control storage circuit 112 selects the high driving ability oscillation invertor 128 from the two oscillation invertors of the oscillation circuit 126. The oscillation invertor 128 starts driving so as to supply a signal having an oscillation frequency of 32 KHz, as the system clock 139, to the CPU 102 through the clock synchronization circuit 138.

When the signal on the reset signal line 144 is made to be in the reset-released state, the CPU 102 starts to operate to read a program in the ROM 104 through the address bus 108 and the data bus 110. The CPU 102 executes data reading and writing on the RAM 106 in accordance with the program read out from the ROM 104. Thus, the operation of the CPU 102 as a computer is realized.

Further, when the CPU 102 has analyzed a command of driving the CPU 102 with a high supply voltage in the course of execution of operation of the program of the ROM 104, the CPU 102 supplies the address bus 108 with address data assigned to the selection control storage circuit 112 to thereby write data "1" in the selection control storage circuit 112 through the data bus 110. Accordingly, the level of the output of the selection control storage circuit 112 becomes HIGH. Accordingly, conversely to the above case, the analog switches 118 and 122 are turned OFF and ON respectively, so that a high reference voltage generated from the reference voltage generating circuit 116, for example 2 V, is supplied to the operational amplifier 124.

The operational amplifier 124 makes the inputted voltage more stable, and supplies the stabilized voltage, as a driving voltage to the microcomputer 100, the low frequency oscillation circuit 125, and the high frequency oscillation circuit 132. The output of the selection control storage circuit 114 selects the low driving ability oscillation invertor 130 of the two oscillation invertors of the oscillation circuit 126. The oscillation circuit 130 starts driving so that a signal having an oscillation frequency of, for example, 1 MHz is supplied, as the system clock 139, to the CPU 102 through the clock synchronization circuit 138.

Figure 3:
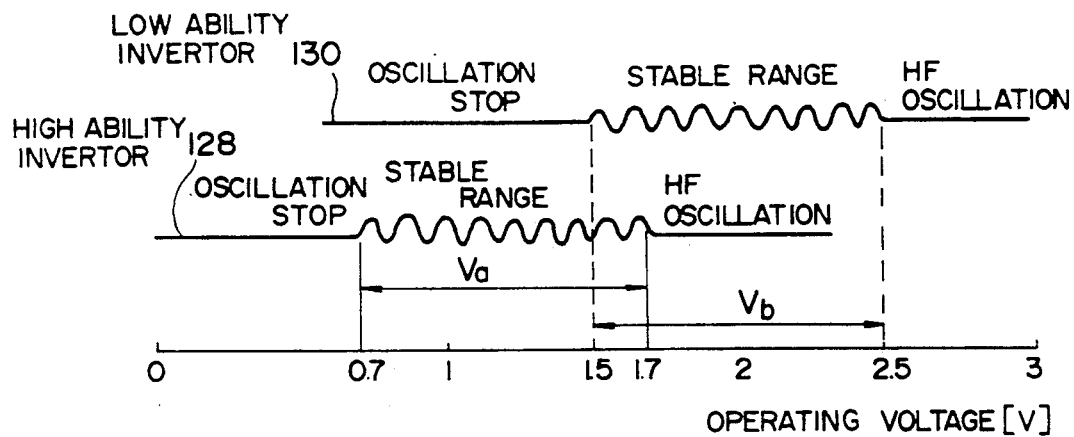
FIG. 3 is a characteristic diagram showing the relation between oscillation invertors having low and high driving abilities respectively.

FIG. 3 is a characteristic diagram showing the relation between the stable ranges of the oscillation invertors 128 and 130 of the low frequency oscillation circuit 126. For example, the oscillation operation of the high driving ability oscillation invertor 128 is stable within a low driving voltage range Va (about 0.7-1.7 V). The oscillation invertor 128 stops oscillating when the driving voltage is lowered over the range Va, while the oscillation invertor 128 causes high frequency oscillation when the driving voltage is raised over the range Va. On the other hand, the oscillating operation of the low driving ability oscillation invertor 130 is stable within a high driving voltage range Vb (about 1.5-2.5 V). The oscillation invertor 130 stops oscillating when the driving voltage is lowered over the range Vb, while the oscillation invertor 130 causes high frequency oscillation when the driving voltage is raised over the range Vb.

Accordingly, it is found that if the output voltage produced from the reference voltage generating circuits 114 and 116 are set to 1 V and 2 V respectively in the embodiment of FIG. 1, the oscillation invertors 128 and 130 of the low frequency oscillation circuits 126 operate stably even if the reference voltage generating circuit is switched from 114 to 116, and further, the oscillation frequency of the low frequency oscillation circuit 126 does not vary and the frequency of the system clock 139 also does not vary even if the driving voltage becomes high.

Further, upon reception of a command of driving the high frequency oscillation circuit 132 in the course of execution of operational processing on the data read out from the ROM 104, the CPU 102 sets each of the selection control storage circuit 112, the high frequency oscillation control circuit 134, and the clock changeover control circuit 138 to "1". The high frequency oscillation circuit 132 starts driving to thereby generate an oscillation frequency, for example, of 3 MHz and supplies the oscillation frequency, as the system clock 139, to the CPU 102 through the clock synchronization circuit 138.

Figure 4:
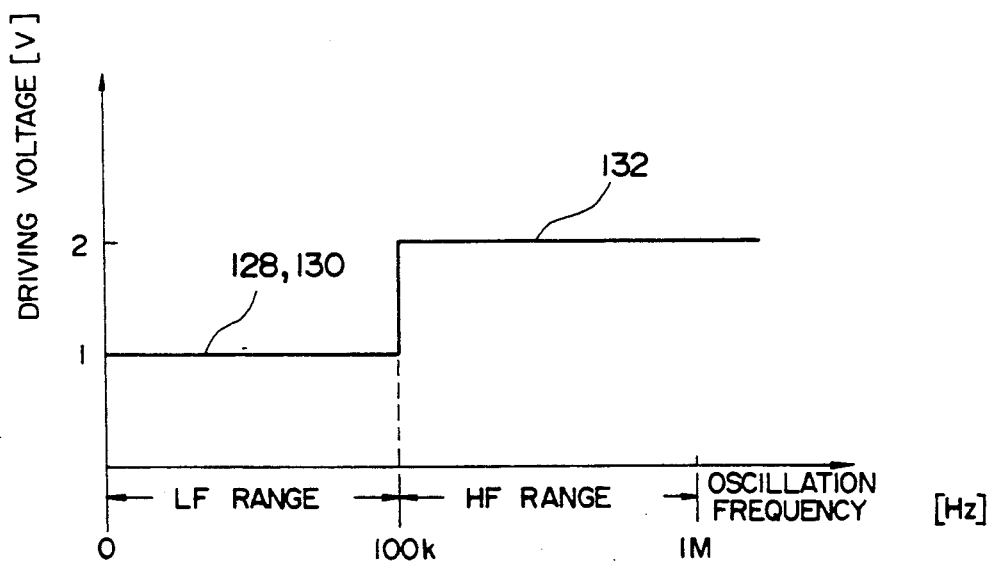
FIG. 4 is a characteristic diagram showing the relation between driving voltages in low and high frequency ranges respectively.

FIG. 4 is a characteristics diagram showing the relation between the oscillation frequency and the driving voltage of the high frequency oscillation circuit 132 and the oscillation invertors 128 and 130 in the low frequency oscillation circuit 126. For example, a low driving voltage is supplied to the oscillation invertor 128 having a high driving ability, while a high driving voltage is supplied to the oscillation invertor 130 a having low driving ability. The oscillation frequencies of the oscillation invertors 128 and 130 are low and are the same with each other. Further, a high driving voltage is supplied to the high frequency oscillation circuit 132, and the oscillation frequency is high. Accordingly, the high frequency oscillation circuit 132 starts driving to thereby generate the high oscillation frequency, and supplies the generated oscillation frequency, as the system clock 139, to the CPU 102 through the clock synchronization circuit 138.

Although two reference voltage generating circuits are used in the embodiment, three or more reference voltage generating circuits may be used. In such a case, each of the number of the analog switches and the number of the oscillation invertors in the low frequency oscillation circuit is made to correspond to the number of the reference voltage generating circuits.

What is claimed is:

1. A semiconductor device comprising:
   a plurality of reference voltage generating circuits for generating reference voltages different from each other;
   a selection control storage circuit for storing a selection signal for selecting one of said reference voltage generating circuits in accordance with a command from a CPU;
   a plurality of analog switches provided respectively corresponding to said reference voltage generating circuits, each of said analog switches being arranged so as to open on the basis of said selection signal supplied thereto to thereby send out the reference voltage from said corresponding reference voltage generating circuit; and
   an oscillation circuit constituted by a plurality of oscillation invertors provided respectively corresponding to said reference voltage generating circuits, said oscillation invertors being provided with said reference voltages supplied through said analog switches as driving voltages, said oscillation invertors being selected on the basis of said selection signal supplied thereto so that an oscillation signal of the selected one of said oscillation invertors is supplied to a microcomputer as a system clock.

2. A semiconductor device according to claim 1, in which said oscillation inverters are different in driving ability from each other, the driving voltages supplied to said oscillation inverters being different from each other so that the higher the driving ability of the oscillation inverter the lower the driving voltage supplied thereto, said oscillation inverters being the same in oscillation frequency with each other.

3. A semiconductor device according to claim 1, in which said oscillation circuit are a pair of oscillation, inverters one of said oscillation inverters having a high driving ability and being supplied with a low driving voltage from one of said analog switches, the other of said oscillation inverters having a low driving ability and being supplied with a high driving voltage from the other of said analog switches, said oscillation inverters being the same in oscillation frequency with each other.

4. A semiconductor device according to claim 3, in which said oscillation circuit is a low frequency oscillation circuit and said semiconductor device further comprises an operational amplifier for stabilizing said reference voltage sent from said analog switch and for supplying said stabilized voltage to said low frequency oscillation circuit.

5. A semiconductor device according to claim 4, in which said microcomputer includes said CPU for executing an operational function and for controlling the operation of said computer, a data bus connected to said CPU for making delivery of data, an address bus connected to said CPU, an ROM connected to said data bus and said address bus and having a program stored therein for determining the operation of said computer, and an RAM connected to said data bus and said address bus for storing data for operational processing.

6. A semiconductor device according to claim 5, further comprising:
- a high frequency oscillation circuit supplied with said reference voltage, as a driving voltage, through said operational amplifier;
- a high frequency oscillation control circuit for controlling drive of said high frequency oscillation circuit on the basis of a command from said CPU;
- a clock change-over control circuit for producing a change-over control signal for selecting one of an output of said low frequency oscillation circuit and an output of said high frequency oscillation circuit on the basis of a command from said CPU; and
- a clock synchronization circuit for selecting one of the output of said low frequency oscillation circuit and the output of said high frequency oscillation circuit in response to said change-over control signal from said clock change-over control circuit, and for synchronizing the selected output so as to supply the synchronized output, as a system clock, to said computer.

7. A semiconductor device according to claim 6, further comprising a reset signal line connected to said CPU of said microcomputer, said selection control storage circuit, said high frequency oscillation control circuit, and said clock change-over control circuit so as to initialize said CPU, said selection control storage circuit, said high frequency oscillation control circuit, and said clock change-over control circuit at the time of turning-on of a power supply or initialization of said semiconductor device.

* * * * *